(12) United States Patent
Ikejiri et al.

(10) Patent No.: US 7,564,265 B2
(45) Date of Patent: Jul. 21, 2009

(54) SEMICONDUCTOR DEVICE WITH ITS TEST TIME REDUCED AND A TEST METHOD THEREFOR

(75) Inventors: Hideo Ikejiri, Tokyo (JP); Shinsuke Onishi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 252 days.

(21) Appl. No.: 11/797,698

(22) Filed: May 7, 2007

(65) Prior Publication Data
US 2008/0071486 A1 Mar. 20, 2008

(30) Foreign Application Priority Data
May 9, 2006 (JP) .............................. 2006-130336

(51) Int. Cl.
*H03K 19/00* (2006.01)
(52) U.S. Cl. .......................................... 326/81; 326/16
(58) Field of Classification Search .................. 714/724; 326/16, 80, 81
See application file for complete search history.

(56) References Cited

U.S. PATENT DOCUMENTS

| 6,404,228 | B1 * | 6/2002 | Luna et al. ...................... 326/66 |
| 7,215,149 | B1 * | 5/2007 | Andrews et al. ............... 326/83 |
| 2004/0041594 | A1 * | 3/2004 | Kang et al. .................. 326/121 |
| 2006/0244709 | A1 * | 11/2006 | Lin ............................. 345/100 |

FOREIGN PATENT DOCUMENTS

JP 2002-111470 4/2002

* cited by examiner

*Primary Examiner*—Don P Le
(74) *Attorney, Agent, or Firm*—Studebaker & Brackett PC; Donald R. Studebaker

(57) ABSTRACT

In a semiconductor device, when a voltage regulator is halted from operating and a test supply voltage is supplied to second logics, the device is initialized by a reset signal. A register included in the device is then reset by an input signal via first logics. The voltage regulator is halted by a power-down signal. Testing is then carried out as the test supply voltage is applied to the second logics. When plural test items are executed successively, a test reset signal is applied to a test reset terminal for each item. As the initialized state of the register is canceled, the first and second logics are initialized.

8 Claims, 4 Drawing Sheets

SEMICONDUCTOR DEVICE WITH ITS TEST TIME REDUCED AND A TEST METHOD THEREFOR

BACKGROUND OF THE INVENTION

1. Field of the Invention

The present invention relates to a semiconductor device including a voltage regulator for regulating the voltage to be supplied to its internal circuitry, and a method of testing the device.

2. Description of the Background Art

Generally, a semiconductor device including a voltage regulator includes first logics operating with a power supply voltage VDD, second logics operating with another power supply voltage VCC different from the power supply voltage VDD, and a register for supplying a power-down signal to the voltage regulator, which are integrated into a semiconductor device, the voltage regulator being adapted for regulating the power supply voltage VDD provided to the first logics so as to generate the power supply voltage VCC to supply the latter to the second logics. When the voltage regulator receives the power-down signal transmitted from the register, the regulator suspends its operation, i.e. interrupts supplying of the power supply voltage VCC to the second logics. In the semiconductor device, the first and second logics and the register are connected to a common reset terminal so that it is possible to initialize the first and second logics and the register at substantially the same timing prior to, e.g. the normal operation of the semiconductor device or an operational test for the first and second logics.

In order to confirm the operation of semiconductor devices against variation in power supply within the allowable range thereof during verification and evaluation of the devices in mass fabrication processes in practice, the semiconductor devices also include a test power supply voltage terminal for applying a test power supply voltage VT to the second logics, by use of which a marginal operation test is carried out on the second logics. The test power supply voltage VT is higher or lower than the power supply voltage VCC and supplied to the second logics under the circumstance where output of the power supply voltage VCC in the voltage regulator is discontinued.

A description will be given below of the marginal operation test carried out on the semiconductor device. Prior to the conduct of marginal operation test, the semiconductor device has the first and second logics and the register reset to their initial state by a reset signal supplied to the common reset terminal described above. When the register is placed in its initial state, the register stops outputting the power-down signal whereby the voltage regulator starts its operation, i.e. starts to provide the power supply voltage to the second logics. The semiconductor device then has the register output the power-down signal to the voltage regulator, whereby the voltage regulator stops outputting the power supply voltage VCC and the test power supply voltage VT is supplied from the test power supply voltage terminal to the second logics in order to execute the first test operation for the first and second logics. After the first test operation completed, the test power supply voltage VT ceases to be supplied to the second logics.

In order to continue the marginal operation test, i.e. to conduct second test, the first and second logics and the register are reset again to their initial state by a reset signal. Due to the resetting, the power supply voltage VCC is supplied to the second logics from the voltage regulator. Thus, the semiconductor device has the register output the power-down signal to the voltage regulator so that the output of the power supply voltage VCC from the voltage regulator is halted in the same way as described above. The test power supply voltage VT is then supplied again to the second logics in order to execute the second test operation for the first and second logics. After the completion of the second test operation, the test power supply voltage VT ceases to be supplied to the second logics and the similar processing will be repeated for the following test operations.

Such a semiconductor device including a voltage regulator is disclosed, for example, by Japanese patent laid-open publication No. 2002-111470, in which the output of the voltage regulator is set to its high impedance state so as to conduct the IDDQ testing for detecting leakage current caused by, e.g. a broken gate of a circuit element of the internal logics.

In the above-described conventional semiconductor device, the first and second logics and the register are, however, arranged such that they are reset simultaneously by a reset signal so that when the first and second logics are initialized, the register is also reset simultaneously to discontinue to output the power-down signal, whereby the voltage regulator supplies the power supply voltage VCC to the second logics. As a result, during the marginal operation test, in order to supply the test power supply voltage VT to the second logics, it is necessary to halt the operation of the voltage regulator. In other words, it is necessary to carry out the processing of halting the output of the power supply voltage VCC from the voltage regulator each time the test operations for the marginal operation test are carried out. Moreover, in order that the test power supply voltage VT will not disturb the power supply voltage VCC output from the voltage regulator in the second logics, it is necessary to halt the test power supply voltage VT from being supplied to the second logics. The result is that the marginal operation test tends to be protracted.

For example, if 200 test items are proceeded to for the marginal operation test and it takes, for example, 5 msec in total for each item to process for halting the operation of the voltage regulator, supplying the test power supply voltage VT to the second logics and discontinuing the power supply of the test power supply voltage VT to the second logics before initializing the first and second logics, then the total time period taken for processing all items is equal to 200 [items]×5 [msec]=1 [sec]. Moreover, in the marginal operation test the device operation is to be checked for a variety of power supply voltage possible in the allowable range. Hence, K different values of the test power supply voltage VT are presupposed where K is an integer equal to or greater than two and represents the number of values of the test power supply voltage VT. If attention is paid to the marginal operation test for a given product under mass fabrication, then the time consumed merely for the above processing is equal to 1 [sec]×K. Turning to the marginal operation test for the totality of the mass fabrication products, the time consumed for the above processing is protracted, thus leading to increased testing costs.

SUMMARY OF THE INVENTION

It is therefore an object of the present invention to provide a semiconductor device in which it is possible to shorten the test time.

A semiconductor device according to the present invention includes first logics operating with a first power supply voltage, a voltage regulator for generating a second power supply voltage different from the first power supply voltage, and second logics operating with the second power supply voltage. The semiconductor device also includes a test power supply voltage terminal for supplying a test power supply voltage to the second logics, a register for outputting a power-down signal to halt the operation of the voltage regulator, and a reset terminal supplied with a reset signal to set the first logics, the second logics and the register to respective initial states. The semiconductor device further includes a test reset terminal supplied with a test reset signal to set the first and second logics to the respective initial states as the setting of the initial state of the register is canceled.

According to the present invention, a semiconductor device includes first logics operating with a first power supply voltage, a voltage regulator for generating a second power supply voltage different from the first power supply voltage, and second logics operating with the second power supply voltage. The semiconductor device also includes a test power supply voltage terminal for supplying a test power supply voltage to the second logics, a register for outputting a power-down signal to halt the operation of the voltage regulator, a reset terminal supplied with a reset signal which causes the first logics, the second logics and the register to be set to respective initial states, and an input/output terminal connected to the first logics. A data signal to be processed by the first logics is entered to, or a data signal processed by the first logics is output from, the input/output terminal. The semiconductor device further includes a logical gate operative in response to a signal entered from the input/output terminal connected to the first logics for outputting a test reset signal which causes the first and second logics to be set to respective initial states as the setting of the initial state of the register is canceled.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
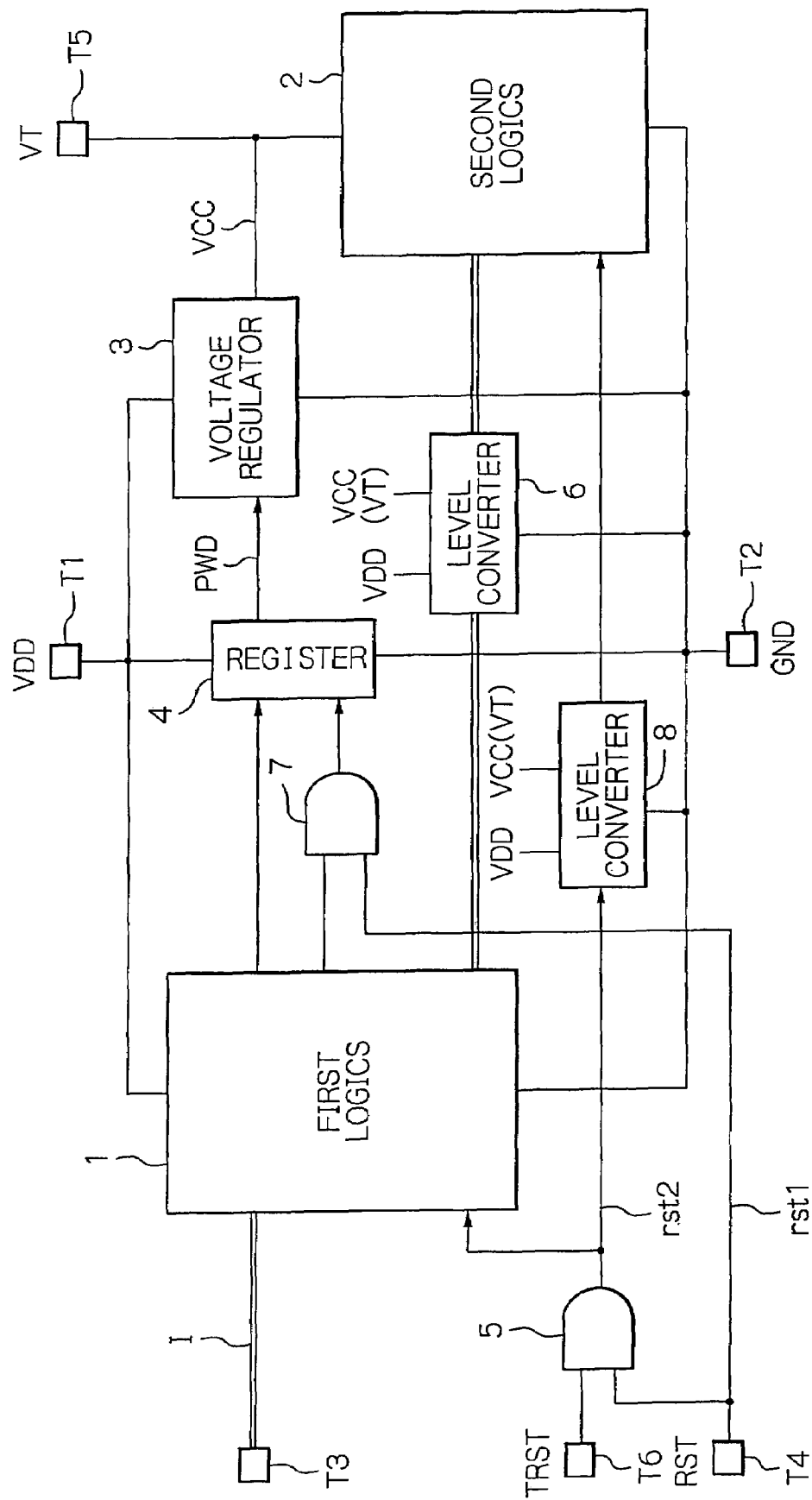
FIG. 1 is a schematic block diagram showing an embodiment of a semiconductor device according to the present invention.

Now with reference to the accompanying drawings, preferred embodiments of a semiconductor device according to the present invention will be described in detail. FIG. 1 is a schematic block diagram showing a preferred embodiment of a semiconductor device 100 according to the present invention.

The semiconductor device 100 includes first logic circuitry or logics 1 operating with a power supply voltage VDD, second logic circuitry or logics 2 operating with another power supply voltage VCC which is different from the power supply voltage VDD, e.g. lower than the power supply voltage VDD, and a voltage regulator 3 for regulating the power supply voltage VCC to be supplied to the second logics 2. The first and second logics 1 and 2 and the voltage regulator 3 may be integrated into the semiconductor device 100. The power supply voltage VDD for the first logics 1 is provided from a power supply voltage terminal or contact pad T1, labeled VDD in the figure, whilst the power supply voltage VCC for the second logics 2 is provided by the voltage regulator 3, which is adapted for converting the power supply voltage VDD provided from the power supply voltage terminal T1 into the power supply voltage VCC. The first and second logics 1 and 2 and the voltage regulator 3 have the common potential sides thereof connected in common to a reference voltage, e.g. ground, terminal T2 labeled GND in the figure and fixed to the ground potential.

To the first logics 1, connected is an input/output terminal T3. The first logics 1 process a signal I supplied on the input/output terminal T3 and output a signal, resultant from the processing to the input/output terminal T3. Signals are designated with reference numerals designating connections on which they are conveyed. The first and second logics 1 and 2 are interconnected via a level converter 6. Specifically, the second logics 2 receive and process a signal output as the results of processing in the first logics 1 so as to supply the signal resultant from the processing to the first logics 1 via the level converter 6. The signal processed by the second logics 2 is output to outside from the input/output terminal T3 via the first logics 1.

The voltage regulator 3 has a function of halting the output of the power supply voltage VCC to the second logics 2 during a standby or test period of time. Specifically, the voltage regulator 3 is arranged such that, when supplied with a power-down signal PWD, the voltage regulator 3 halts the operation of voltage conversion and sets its high impedance state on the output terminal. It is noted that the power-down signal PWD is provided to the voltage regulator 3 from a register 4 which is adapted to hold a power-down command output from the first logics 1 to output the latter in the form of power-down signal PWD. The register 4 is adapted to operate with the power supply voltage VDD so as to be optionally set or reset in response to a command signal from the first logics 1, or be forced to be reset by a reset signal rst1 described later. Specifically, the register 4 is connected to a logical gate 7, e.g. a logical AND gate, which is supplied with a command signal supplied from the first logics 1 and the reset signal rst1. When the register 4 is reset, the output of the power-down signal PWD is halted, e.g. goes low, thereby the voltage regulator 3 executing its normal operation, that is, the voltage regulator 3 outputting the predetermined power supply voltage VCC to the second logics 2. It is noted that the register 4 is connected to the ground terminal T2 similarly to the first and second logics 1 and 2 and the voltage regulator 3.

The semiconductor device 100 also includes a reset terminal T4, supplied with a reset signal RST, and a test reset terminal T6, supplied with a test reset signal TRST during testing. It is noted that these reset signals RST and TRST go high in the normal operation, while, in reset operation, they go low.

The reset signal RST, supplied to the reset terminal T4, is supplied to the register 4 as the reset signal rst1, while being also supplied to one input of a two-input logical gate 5, such as an AND gate. The reset signal TRST, supplied to the test reset terminal T6, is transmitted to the other input of the logical gate 5, an output signal of which is supplied as a reset signal rst2 to the first and second logics 1 and 2. The logical gate 5 is adapted to be operable with the power supply voltage VDD. The reset signal rst1, transmitted as the one input to the logical gate 5, is supplied to the first logics 1 in the form of reset signal rst1. The reset signal rst2, output from the logical gate 5, is transmitted via the level converter 8 to the second logics 2. The level converter 8 functions as converting the reset signal rst2, output from the logical gate 5, at the power supply voltage VDD, into a signal of a level compatible with the power supply voltage VCC of the second logics 2 or a test power supply voltage VT.

The semiconductor device 100 also includes a test power supply voltage terminal T5 for applying the test power supply voltage VT to the second logics 2 in case the operation of the voltage regulator 3 is halted for a marginal operation test for evaluation at the time of mass fabrication. The test power supply voltage VT is supplied to the second logics 2 as a voltage different from the power supply voltage VCC, that is, as a voltage higher or lower than the power supply voltage VCC.

Furthermore, when the semiconductor device 100 is implemented as, for example, a sound generator fabricated in the form of large-scale integration (LSI) device, the first logics 1 include a digital-to-analog converter or an input/output circuit which is interconnected around the second logics 2, which include a decoder for an audio data signal. The second logics 2 may include a digital filter which functions as an equalizer for the audio data signal. In that application, the second logics 2 are connected to receive the audio data signal and provide a corresponding pulse code modulation (PCM) data signal to the first logics 1. Alternatively, the second logics 2 per se may be implemented as a sound generator.

Figure 2:
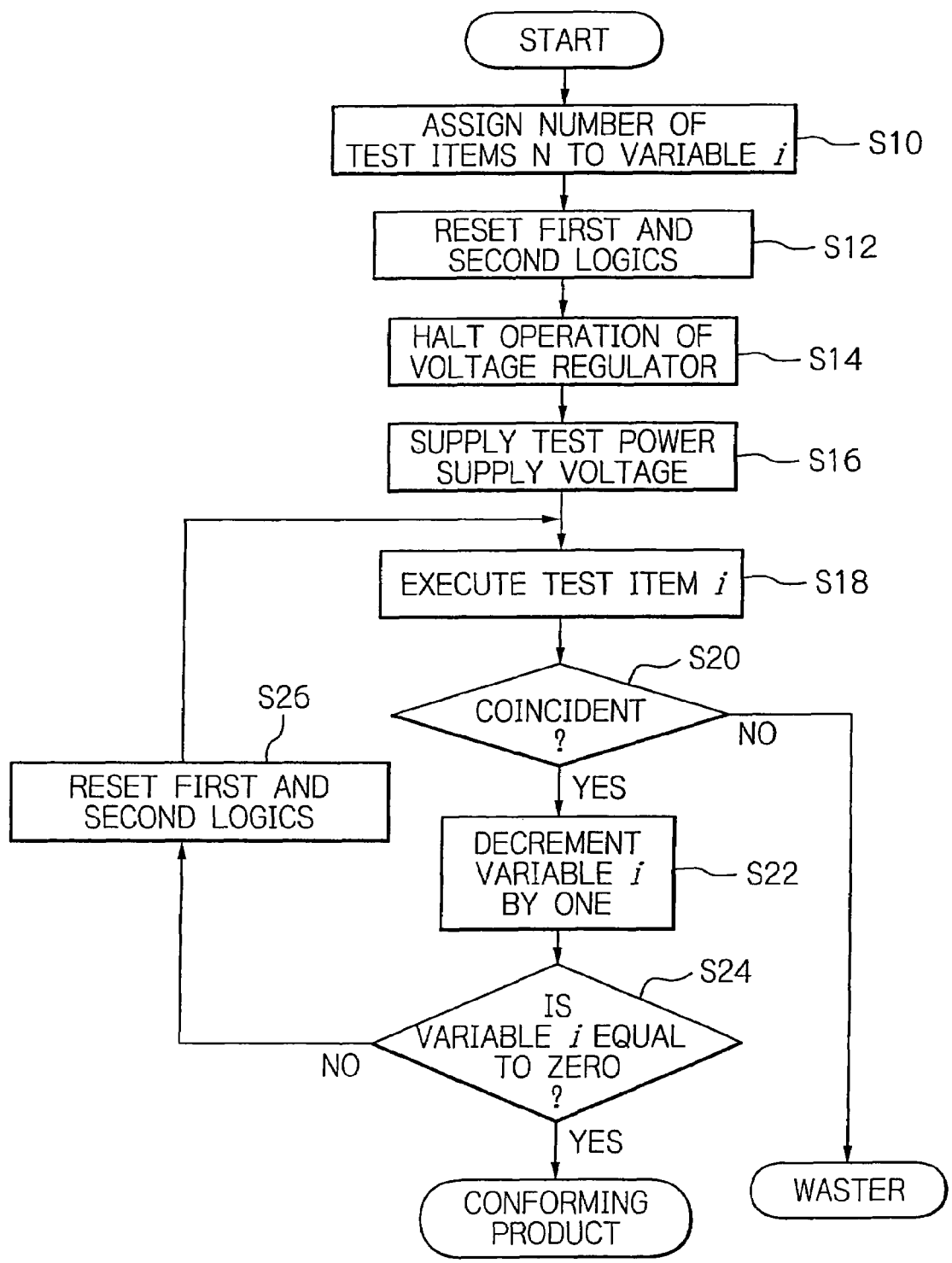
FIG. 2 is a flow chart useful for understanding a specific test procedure on the semiconductor device shown in FIG. 1.
Figure 3:
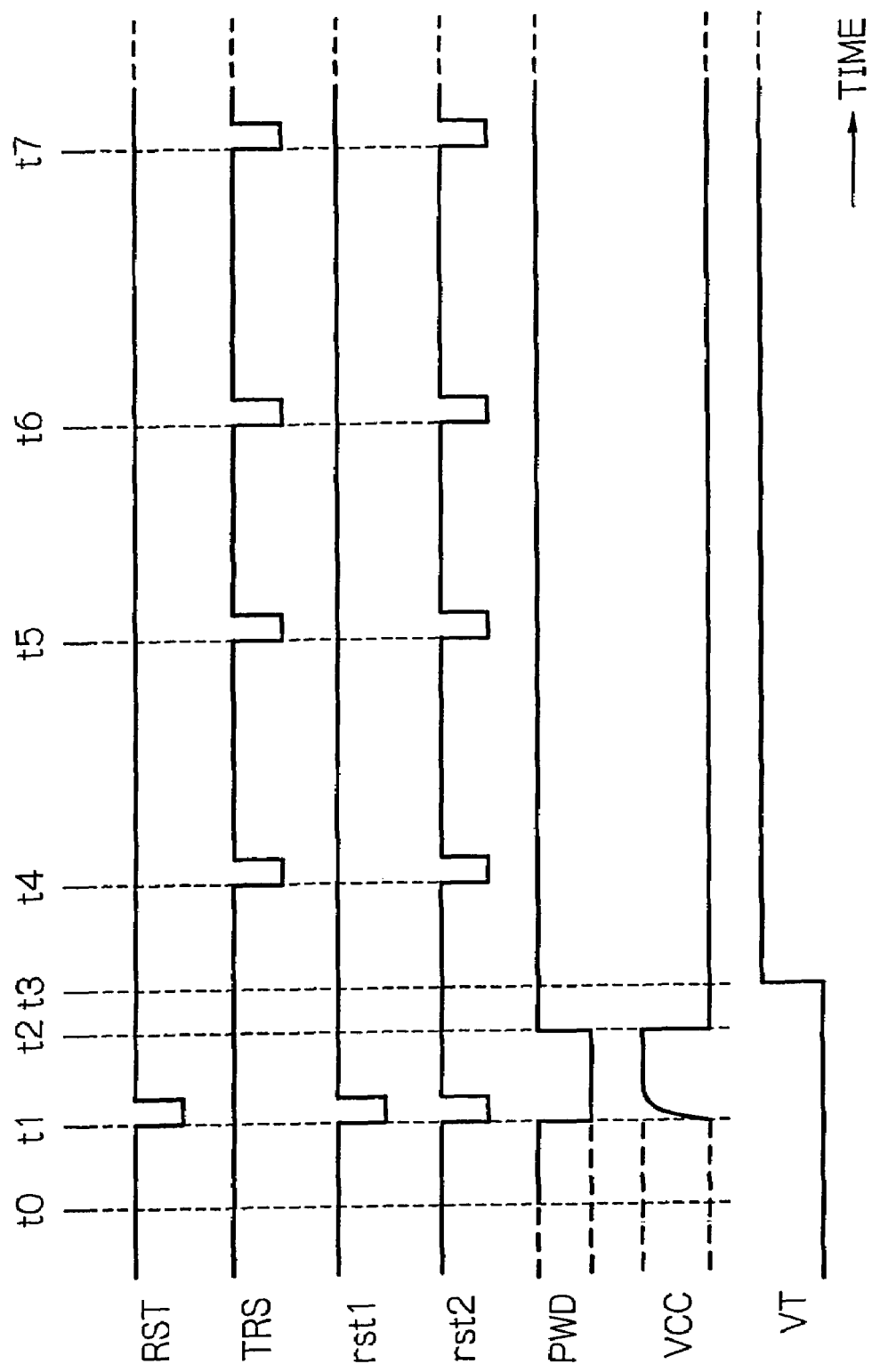
FIG. 3 is a timing chart useful for understanding an operational sequence of the semiconductor device in the test operation shown in FIG. 2.

FIG. 2 is a flowchart showing a test method of the semiconductor device of FIG. 1, and FIG. 3 depicts signal waveforms appearing in the operation during the marginal operation test of the semiconductor device shown in FIG. 1. The marginal operation test conducted during mass fabrication of the semiconductor device of FIG. 1 will now be described with reference to FIGS. 2 and 3. The number of items of the marginal operation test is represented by N.

The semiconductor device 100 is connected to a tester device, not shown, which in turn applies the preset power supply voltage VDD to the power supply voltage terminal T1. At this time, both the reset signal RST applied to the reset terminal T4 and the test reset signal TRST applied to the test reset terminal T6 are of high level. Thus, as indicated at timing t0 in FIG. 3, both the reset signals rst1 and rst2 are high in level. On the other hand, the state of the register 4 is undetermined, such that the power-down signal PWD remains low or high, and the state of the voltage regulator 3 is affected by the level of the power-down signal PWD.

When the marginal operation test is initiated, the number of test items N is assigned to a variable i (step S10).

The reset signal RST is then applied to the reset terminal T4 at timing t1 as shown in FIG. 3, i.e. the reset signal RST is forced low for a given period of time (step S12), whereby the reset signals rst1 and rst2 go low so as to have the first and second logics 1 and 2 initialized. On the other hand, the register 4 is reset at this time point regardless of its state, so that the power-down signal PWD is halted and goes low. When the reset signals rst1 and rst2 go high, after the lapse of the aforementioned preset time duration, the first and second logics 1 and 2 and the register 4 are released from their reset states. However, since the power-down signal PWD goes low, the voltage regulator 3 is in its operating state, irrespective of the states which prevailed up to this time whereby the power supply voltage VCC is output.

At the next timing t2, processing is carried out for halting the operation of the voltage regulator 3 and the power supply voltage VCC (step S14). This processing is carried out such that a predetermined pattern of input signal I is applied one by one to, for example, the input/output terminal T3, and a power-down command is output from the first logics 1 to set the register 4, whereby the power-down signal PWD outputting from the register 4 goes high so as to halt the operation of the voltage regulator 3. The power supply voltage VCC becomes substantially equal to zero, with the output of the voltage regulator 3 being in its high-impedance state.

At the next timing t3, the test power supply voltage VT is applied to the test power supply voltage terminal T5 after the halting of the operation of the voltage regulator 3 (step S16), so that the test item i scheduled is executed (step S18).

Specifically, for example, the semiconductor device 100 may have the first logics 1 supplied with a predetermined operation signal for testing as the input signal I from the input/output terminal T3 in order to output a signal resultant from the processing by the first logics 1 from the input/output terminal T3. Alternatively, the device 100 may have the second logics 2 supplied with a predetermined operation signal for testing as the input signal I from the input/output terminal T3 transmitted via the first logics 1 so as to output signal resultant from the processing by the second logics 2 as an output signal from the input/output terminal T3 via the first logics 1.

When the signal resultant from the processing in the second logics 1 or 2 is obtained as a test result from the input/output terminal T3, the checking process will be executed. Specifically, it is determined whether or not the signal indicating the results of the step S18 is coincident with the predetermined value (step S20). If the signal is not coincident with the predetermined value (No step S20), then the semiconductor device 100 being tested is verified to be unacceptable, i.e. waster and the test is immediately terminated without being checked by further items of the marginal operation test. On the other hand, if the signal is coincident with the predetermined value (Yes step S20), then the test of the item i is determined to be acceptable so that the variable i is decremented by one (step S22), and it is verified whether or not the value of the variable i is equal to a predetermined value, e.g. "0" (step S24).

If the variable i is equal to "0" (Yes, step S24), then all of the scheduled test items have come to a close. On the other hand, if the value of the variable i is not equal to "0" (No, step S24), then the scheduled test items have not come to a close, so that processing transfers to the step S26.

In the step S26, at a timing t4, FIG. 3, the reset signal TRST is applied to the test reset terminal T6, i.e. the reset signal TRST is forced low only for a given period of time, whereby the reset signal rst2 becomes low level, so that the first and second logics 1 and 2 are set to be in initial states. On the other hand, since the reset signal rst1 remains high, the register 4 remains in its set state, and hence the power-down signal PWD remains high, with the operation of the voltage regulator 3 remaining in the halted state. After the processing in the step S26, processing reverts to the step S18 to repeat the processing of the steps S15 to S18. After the processing in the above step S26, the operational test item, indicated by the variable i−1, is carried out as the test power supply voltage VT is supplied from the test power supply voltage terminal T5 to the second logics 2. After the end of the acceptability/non-acceptability decision concerning the operational test item, specified by the variable i-1, if the semiconductor device 100 being tested is found to be acceptable, the first and second logics 1 and 2 are set to their initial states, by the reset signal rst2, at timing t5, FIG. 3, without setting the register 4 to its initial state. Then, each time the operational test items i-2, i-3, . . . are executed, the first and second logics 1 and 2 are set to their initial states, by the reset signal rst2, at timings specified by time points t6, t7, . . . , FIG. 3, without setting the register 4 to the initial state.

In the above-described operation test, the operational test items, indicated by the test variables i, i-1, i-2, i-3, . . . are carried out a number of times equal to the number of test items N, as the test power supply voltage VT, different from the power supply voltage VCC, is kept constant. Thereafter, the plurality (N) of operational test items, represented by the variables i, i-1, i-2, i-3, . . . , are carried out in accordance with the flow shown in FIG. 2 with the test power supply voltage VT varied, that is, with the test power supply voltage VT set to a value higher or lower than the power supply voltage VCC. In this manner, the marginal operation test is executed on semiconductor devices 100, including the voltage regulator 3.

The above is the description of the operation for evaluation and test during mass fabrication of the semiconductor devices 100. If the semiconductor device 100 is verified to be acceptable and mounted into a utility device, the test power supply voltage terminal T5 is set free from its connected state, while the test reset terminal T6 is fixed to its high level. In such a case, the first and second logics 1 and 2 and the register 4 may be reset simultaneously in response to the reset signal RST when applied to the reset terminal T4.

As described above, the semiconductor device 100 of the present embodiment includes, in addition to the reset terminal T4 for resetting the first and second logics 1 and 2 and the register 4 altogether, the test reset terminal T6 and the logic circuit, such as AND gate 5, configured to reset the first and second logics 1 and 2 without resetting the register 4. Thus, in the marginal operation test for evaluation, in the course of mass fabrication, solely the first and second logics 1 and 2 may be reset by applying the reset signal TRST from the test reset terminal T6. Therefore, in the present illustrative embodiment, the processing of halting the voltage regulator 3 from operating, that is, halting the power supply voltage VCC from being supplied to the second logics 2, each time the first and second logics 1 and 2 are set to the initial states thereof, that is, reset, before carrying out each operation test, may be dispensed with, while the processing of halting the supply of the test power supply voltage VT to the second logics 2 after the end of each operation test may also be dispensed with, as may be apparent from the flowchart of FIG. 2. Moreover, since the latter processing may be dispensed with, the processing of supplying the test power supply voltage VT to the second logics 2 before carrying out each operational test may also be dispensed with. Specifically, the semiconductor device 100 of the instant embodiment has a merit that only short marginal operation test time may suffice during the time of mass fabrication.

Figure 4:
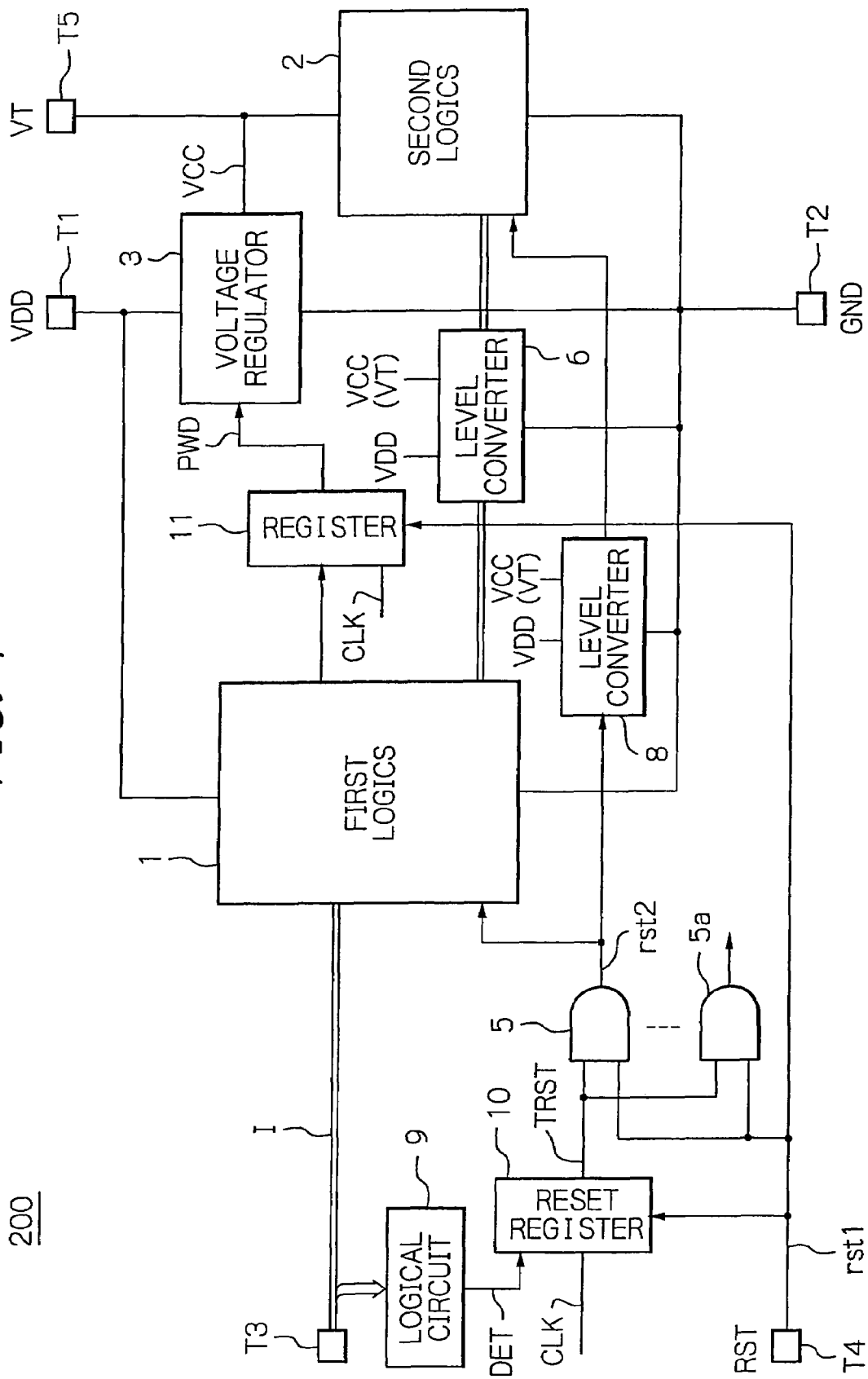
FIG. 4 is another schematic block diagram, like FIG. 1, showing an alternative embodiment of a semiconductor device according to the present invention.

FIG. 4 schematically shows a semiconductor device 200 according to an alternative embodiment of the present invention. In FIG. 4, structural parts and elements like those shown in FIG. 1 are designated by identical reference numerals, and will not be described repetitively in order to avoid redundancy.

The semiconductor device 200 does not include the reset terminal T6, FIG. 1, supplied with the test reset signal TRST. In its stead, there is provided a logical circuit 9 adapted for outputting a detection signal DET and a reset register 10 adapted for holding the detection signal DET in timed with a clock signal CLK for outputting the detection signal as a test reset signal TRST. On receipt of a specified address signal, the logical circuit 9 outputs the detection signal DET, which goes high, in response to the input signal I supplied from the input/output terminal T3. The input signal I is such a signal whose use is limited during the normal operation by a user of the present semiconductor device 200. The reset register 10 is formed by, for example, a flip-flop, as shown in FIG. 4, and a test reset signal TRST is output from its output terminal.

The test reset signal TRST, output from the reset register 10, is applied to the logical gate 5, such as an AND gate. A reset signal rst2, output from the logical gate 5, is applied to the first logics 1, while being applied via the level converter 8 to the second logics 2. The level converter 8 converts the reset signal rst2, output from the logical gate 5 at the power supply voltage VDD, into a signal of the level consistent with the power supply voltage VCC or the test power supply voltage VT.

In parallel with the logical gate 5, provided are a plural number of logical gates, such as a logical gate 5a. In an application where the semiconductor device 200 of the instant embodiment has a sound or music source function, those logical gates, such as the logical gate 5a, are adapted to, for example, output reset signals for such a register, not shown, as setting the sound volume or setting from which one of the left and right headphones the sound is to be output.

Moreover, the present semiconductor device 200 is provided with a register 11, similar to the reset register 10, in place of the register 4 shown in FIG. 1. The register 11 is formed by, for example, a flip-flop, and adapted to hold a power-down command, output from the first logics 1 in timed with the clock signal CLK, to output the latter in the form of power-down signal PWD. These registers 10 and 11 are forced to be reset by a reset signal RST applied to the reset terminal T4. The remaining configuration of the instant alternative embodiment may be the same as the illustrative embodiment shown in and described with reference to FIG. 1.

In operation, during the marginal operation test for evaluation in the course of mass fabrication of the semiconductor devices 200, the test reset signal TRST is not applied from the test reset terminal, but a signal, which is prohibited in the normal operation from being used by the user of the semiconductor device 200, is fed to the input/output terminal T3 connected to the first logics 1. The control flow of the marginal operation test for the semiconductor device 200 of the alternative embodiment may be similar to that for the semiconductor device 100 of the illustrative embodiment shown in FIG. 2. In addition, the signal waveforms, appearing in the operation during the marginal operation test of the semiconductor device 200 of the alternative embodiment, may also be similar to those appearing in the operation during the marginal operation test of the semiconductor device 100 of the illustrative embodiment shown in FIG. 3.

When the marginal operation test of the semiconductor device 200 of the alternative embodiment is commenced, the number of test items N is set in a variable i in a step S11 of FIG. 2. The reset signal RST is then applied to the reset terminal T4 at timing t1 as shown in FIG. 3, i.e. the reset signal RST is forced low for a given period of time (step S12), whereby the reset signal rst2 goes low so as to have the first and second logics 1 and 2 initialized. On the other hand, the register 11 is reset, at this time point, regardless of the states which prevailed up to this time, so that the power-down signal PWD goes low, i.e. the register 11 allows for the operation of the regulator 3. When the reset signals rst1 and rst2 both go high after the lapse of the aforementioned predetermined time, the first and second logics 1 and 2 and the register 11 are released from their reset states. However, since the power-down signal PWD remains low, the voltage regulator 3 is in its operative state, irrespective of the states which prevailed so far, and hence the power supply voltage VCC is output.

In a step S14, at the timing t2 of FIG. 3, a predetermined pattern of input signal I is applied one by one to the input/output terminal T3, and a power-down command is output from the first logics 1 to set the register 11 to output the power-down signal PWD. This halts the operation of the voltage regulator 3, that is, halts the output of the power supply voltage VCC.

Then, as the operation of the voltage regulator 3 is halted, the test power supply voltage VT is applied to the test power supply voltage terminal T5 in a step S16, at the timing t3 of FIG. 3. The operational test item i for the first and second logics 1 and 2 is carried out, in a step S18, and the test results are verified. Then, processing transfers to a step S26 in order to execute the testing of the remaining test items. The operation of test execution in this step is similar to that for the operational test item 1 in the illustrative embodiment shown in FIG. 1.

Upon receipt of a specified address signal, in the step S26 at the timing t4 in FIG. 3, the detection signal DET, output from the logical circuit 9, goes high in response to the input signal I supplied from the input/output terminal T3. The detection signal DET is held in the reset register 10, in timed with the clock signal CLK. From the output terminal of the reset register 10, the test reset signal TRST of the level low is output and transferred to the logical gate 5. In this manner, the first and second logics 1 and 2 are reset, without resetting the register 11, adapted for outputting the power-down signal PWD, that is, as the operation of the voltage regulator 3 remains in the state of cessation. After the processing of the step S26, processing reverts to the step S18, in the same way as in the illustrative embodiment shown in FIG. 1, to repeat the processing of the steps S15 to S18.

In the above-described operational test, the operational test items, indicated by the test variables i, i-1, i-2, i-3, . . . are carried out a number of times equal to the number of test items N, as the test power supply voltage VT, different from the power supply voltage VCC, is kept constant. The marginal operation tests for the semiconductor device 200, each including the voltage regulator 3, are carried out in accordance with the control flow shown in FIG. 2 with the test power supply voltage VT varied, that is, as the test power supply voltage VT is set to a value higher or lower than the power supply voltage VCC.

With the semiconductor device 200 of the present alternative embodiment, provided with the logical gate 9 and the reset register 10, the test reset signal TRST for setting the first and second logics 1 and 2 in the initial states may be generated, in response to the input signal I supplied to the input/output terminal T3 connected to the first logics 1, as the voltage regulator 3 is halted. Consequently, the favorable advantages similar to those of the embodiment shown in FIG. 1 may be attained with the number of terminals of the semiconductor device 200 suppressed from increasing.

The present invention is not limited to the above-described specific embodiments but may be modified in a number of ways. For example, the present invention may be applied to further alternative embodiments read as follows. The illustrative embodiments are designed to take the reference levels of the reset signal RST and the test reset signal TRST to be low. If the high level is to be the reference level, then a logical OR gate may be used as the logical gate 5 in place of the AND gate. Additionally, the register 4 shown in FIG. 1 may be constituted by a flip-flop. The reset register 10, shown in FIG. 4, may be omitted and the output signal (detection signal DET) from the logical circuit 9 may be connected to directly be applied as the test reset signal TRST to the logical gate 5.

There is provided a test method of a semiconductor device which includes first logics operating with a first supply voltage, a voltage regulator for generating a second power supply voltage different from the first power supply voltage, a second logics operating with the second power supply voltage, and a register for controlling an operation of the voltage regulator, the method executing a plurality of operational test items on the semiconductor device. In the method, the first and second logics and the register are set to respective initial states before initiating execution of the operational test items; an operation of the voltage regulator is halted by the register after the register is set to the initial state; plural operational test items for the second logics are carried out while a test power supply voltage higher or lower than the second power supply voltage is supplied to the second logics; and the first and second logics are established in respective initial states while the setting of the initial state of the register is canceled.

In accordance with one aspect of the present invention, there is provided a test method of a semiconductor device which includes first logics operating with a first supply voltage, a voltage regulator for generating a second power supply voltage different from the first power supply voltage, second logics operating with the second power supply voltage, and a register for controlling an operation of the voltage regulator, the method executing a plurality of operational test items on the semiconductor device. In the method, a reset signal causing the first and second logics to be set to respective initial states before the execution of the plural operational test items differs from a reset signal causing the first and second logics to be set to the respective initial states after the execution of the plural operational test items.

In accordance with another aspect of the present invention, there is provided a test method of a semiconductor device which includes first logics operating with a first supply voltage, a voltage regulator for generating a second power supply voltage different from the first power supply voltage, a second logics operating with the second power supply voltage, and a register for controlling an operation of the voltage regulator, the method executing a plurality of operational test items on the semiconductor device. In the method, a reset signal causing the first and second logics to be set to respective initial states after the execution of the plural operational test items is generated in response to an input signal entered from an input/output terminal connected to the first logics.

In accordance with still another aspect of the present invention, there is provided a test method of a semiconductor device which includes first logics operating with a first supply voltage, a voltage regulator for generating a second power supply voltage different from the first power supply voltage, a second logics operating with the second power supply voltage, and a register for controlling an operation of the voltage regulator, the method executing a plurality of operational test items on the semiconductor device. In the method, after the execution of the plural operational test items as the test power supply voltage is supplied, the plural operational test items are again executed as the test power supply voltage has been changed in level to execute a marginal operation test for the second logics.

The entire disclosure of Japanese patent application No. 2006-130336 filed on May 9, 2006, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A semiconductor device comprising:
   first logics operating with a first power supply voltage supplied from a power supply voltage terminal;
   a voltage regulator for generating a second power supply voltage based on the first power supply voltage, the second power supply voltage being different from the first power supply voltage;
   second logics operating with the second power supply voltage;
   a test power supply voltage terminal for supplying said second logics with a test power supply voltage, which is higher or lower than the second power supply voltage;
   a register for outputting a power-down signal to halt an operation of said voltage regulator;
   a reset terminal supplied with a reset signal to set said first logics, said second logics and said register in respective initial states; and
   a test reset terminal supplied with a test reset signal which causes said first logics and said second logics to be set to respective initial states as setting of an initial state of said register is canceled.

2. The semiconductor device in accordance with claim 1, further comprising:
   a logical gate having an input connected to said reset terminal and said test reset terminal and an output connected to said first logics and said second logics;
   said logical gate establishing an initial state of said first logics and said second logics based on signal levels of the reset signal and the test reset signal.

3. The semiconductor device in accordance with claim 2, wherein said reset terminal and said test reset terminal are connected via said logical gate to said first and second logics; and
   said reset terminal is connected to said register without intermediary of said logical gate.

4. The semiconductor device in accordance with claim 1, wherein said register is connected to said first logics and outputs the power-down signal under control of said first logics.

5. A semiconductor device comprising:
   first logics operating with a first power supply voltage supplied from a power supply voltage terminal;
   a voltage regulator for generating a second power supply voltage based on the first power supply voltage, the second power supply voltage being different from the first power supply voltage;
   a second logics operating with the second power supply voltage;
   a test power supply voltage terminal for supplying said second logics with a test power supply voltage, which is higher or lower than the second power supply voltage;
   a register for outputting a power-down signal to halt an operation of said voltage regulator;
   a reset terminal supplied with a reset signal to set said first logics, said second logics and said register in respective initial states;
   an input/output terminal connected to said first logics for receiving a data signal which is to be processed by said first logics or outputting a data signal processed by said first logics; and
   a logical gate operative in response to a signal received by said input/output terminal for outputting a test reset signal which causes said first logics and said second logics to respective initial states as setting of an initial state of said register is canceled.

6. The semiconductor device in accordance with claim 5, further comprising a logical circuit for outputting a detection signal on receipt of a signal received by said input/output terminal, the test reset signal being output in response to the detection signal.

7. The semiconductor device in accordance with claim 5, wherein said reset terminal is connected to said register without intermediary of said logical circuit.

8. The semiconductor device in accordance with claim 5, wherein said register is connected to said first logics and outputs the power-down signal under control of said first logics.

* * * * *